United States Patent [19]

Sakaguchi et al.

[11] Patent Number: 5,966,620
[45] Date of Patent: Oct. 12, 1999

[54] PROCESS FOR PRODUCING SEMICONDUCTOR ARTICLE

[75] Inventors: Kiyofumi Sakaguchi, Yokohama; Takao Yonehara, Atsugi, both of Japan

[73] Assignee: Canon Kabshiki Kaisha, Tokyo, Japan

[21] Appl. No.: 08/970,356

[22] Filed: Nov. 14, 1997

[30] Foreign Application Priority Data

Nov. 15, 1996 [JP] Japan .................................. 8-304541

[51] Int. Cl.⁶ ............................ H01L 21/30; H01L 21/46
[52] U.S. Cl. ........................................... 438/455; 438/458
[58] Field of Search ................................... 438/455, 458, 438/459

[56] References Cited

U.S. PATENT DOCUMENTS

| | | | |
|---|---|---|---|
| 4,816,420 | 3/1989 | Bozler . | |
| 5,371,037 | 12/1994 | Yonehara | 437/86 |
| 5,374,564 | 12/1994 | Bruel | 437/24 |
| 5,374,581 | 12/1994 | Ichikawa et al. | 438/459 |
| 5,559,043 | 9/1996 | Bruel | 437/24 |
| 5,773,355 | 6/1998 | Inoue et al. | 438/459 |
| 5,854,123 | 12/1998 | Sato | 438/507 |

FOREIGN PATENT DOCUMENTS

| | | |
|---|---|---|
| 553852A2 | 8/1993 | European Pat. Off. . |
| 0767486 | 4/1997 | European Pat. Off. . |
| 5-21338 | 1/1993 | Japan . |
| 5211128 | 8/1993 | Japan . |
| 7302889 | 11/1995 | Japan . |
| 8213645 | 8/1996 | Japan . |

OTHER PUBLICATIONS

M. Bruel, "Application of hydrogen ion beams to Silicon On Insulator material technology", Nucl. Instr. and Meth. in Phys. Res., vol. 108 (1996), pp. 313–319.

Q. Tong, "Semiconductor wafebonding: recent developments", Materials Chem. and Phys., vol. 37 (Mar. 1994), pp. 101–127.

Patent Abstracts of Japan, vol. 016, No. 166 (E–1193), Apr. 22, 1992 (JP 04–014705).

B. Aspar, "Transfer of structured and patterned thin silicon films using the Smart–Cut process", Elect. Letters, vol. 32 (Oct 10, 1996).

Imai, "Crystalline Quality of Silicon Layer Formed by FIPOS Technology", *J. Crystal Growth,* vol. 63, No. 3, pp. 547–553 (1983).

Maszara, "Silicon–On–Insulator by Wafer Bonding: A Review", *J. Electrochem. Soc.,* vol. 138, No. 1, pp. 341–347 (1991).

Harendt, "Silicon on Insulator Material by Wafer Bonding", *J. Elect. Mater.,* vol. 20, No. 3, pp. 267–277 (1991).

Baumgart, "Light Scattering Topography Characterization of Bonded SOI Wafers", Extended Abstract of ECS First International Symposium of Wafer Bonding, pp. 375–385 (1991).

Hunt, "Thinning of Bonded Wafers: Etch–Stop Approaches", Extended Abstract of ECS First International Symposium of Wafer Bonding, pp. 165–173 (1991).

Yonehara, "Epitaxial layer transfer by bond and etch back of porous Si", *Appl. Phys. Lett.,* vol. 64, No. 16, pp. 2108–2110 (1994).

*Primary Examiner*—Kevin M. Picardat
*Attorney, Agent, or Firm*—Fitzpatrick, Cella, Harper & Scinto

[57] ABSTRACT

A novel process for producing a semiconductor article is disclosed which comprises the steps of preparing a first substrate constituted of a silicon substrate, a nonporous semiconductor layer formed on the silicon substrate, and an ion implantation layer formed in at least one of the silicon substrate and the nonporous semiconductor layer; bonding the first substrate to a second substrate to obtain a multiple layer structure with the nonporous semiconductor layer placed inside; separating the multiple layer structure at the ion implantation layer; and removing the ion implantation layer remaining on the separated second substrate.

52 Claims, 5 Drawing Sheets

PROCESS FOR PRODUCING SEMICONDUCTOR ARTICLE

BACKGROUND OF THE INVENTION

1. Field of the Invention

This invention relates to a process for producing a semiconductor article that can suitably be used for producing a semiconductor device such as a semiconductor integrated circuit, a solar cell, a semiconductor laser device or a light emitting diode. More particularly, it relates to a process for producing a semiconductor article comprising a step of transferring a semiconductor layer onto a substrate.

2. Related Background Art

Semiconductor articles are popular in terms of semiconductor wafers, semiconductor substrates and various semiconductor devices and include those adapted for producing semiconductor devices by utilizing the semiconductor region thereof and those used as preforms for producing semiconductor devices.

Some semiconductor articles of the type under consideration comprise a semiconductor layer arranged on an insulator.

The technology of forming a single crystal silicon semiconductor layer on an insulator is referred to as silicon on insulator (SOI) technology, which is widely known. Various research has been done to exploit the remarkable advantages of SOI that cannot be achieved by using bulk Si substrates that are used for producing ordinary Si integrated circuits. The advantages of the SOI technology include:

1. the ease of dielectric isolation that allows an enhanced degree of integration;
2. the excellent resistivity against radiation;
3. a reduced floating capacitance that allows a high device operation speed;
4. the omission of the well forming step;
5. the effect of latch up prevention; and
6. the possibility of producing fully depleted field effect transistors using the thin film technology. The advantages of the SOI technology are thoroughly discussed in Special Issue: "Single-crystal silicon on non-single-crystal insulators"; edited by G. W. Cullen, Journal of Crystal Growth, volume 63, No. 3, pp. 429–590 (1983).

In recent years, a number of reports have been published on the SOI technology for providing substrates that can realize high speed operation and low power consumption for MOSFETs (IEEE SOI conference 1994). The process of manufacturing a semiconductor device can be significantly curtailed by using the SOI structure if compared with the corresponding process of manufacturing a device on a bulk Si wafer because of the implementation of a very simplified device isolation step. Thus, the use of the SOI technology can provide a significant cost reduction in manufacturing a semiconductor device particularly in terms of the wafer cost and the process cost if viewed from the conventional technology of manufacturing a MOSFET or an IC on a bulk Si substrate, to say nothing of the remarkable performance of such a semiconductor device.

Fully depleted MOSFETs are very promising for achieving high speed operation and low power consumption if provided with improved drive power. Generally speaking, the threshold voltage (Vth) of a MOSFET is determined as a function of the impurity concentration of its channel section but, in the case of a fully depleted (FD) MOSFET, the characteristics of the depletion layer are influenced by the SOI film thickness. Therefore, the SOI film thickness has to be rigorously controlled in order to improve the yield of manufacturing LSIs.

Meanwhile, a device formed on a compound semiconductor shows a remarkable level of performance that cannot be expected from silicon particularly in terms of high speed operation and light emission. Such devices are currently formed by means of epitaxial growth on a compound semiconductor substrate that may be made of GaAs or a similar compound. However, a compound semiconductor substrate is costly and mechanically not very strong and therefore it is not suitable to produce a large wafer.

Thus, efforts have been made to form a compound substrate by hetero-epitaxial growth on an Si wafer that is inexpensive, mechanically strong and good for producing a large wafer.

Research on forming SOI substrates became remarkable in the 1970s. Initially, attention was paid to the technique of producing single crystal silicon by epitaxial growth on a sapphire substrate (SOS: silicon on sapphire), that of producing an SOI structure through full isolation by porous oxidized silicon (FIPOS) and the oxygen ion implantation technique. The FIPOS method comprises steps of forming an islanded N-type Si layer on a P-type single crystal Si substrate by proton/ion implantation (Imai et al., J.Crystal Growth, Vol. 63,547 (1983)) or by epitaxial growth and patterning, transforming only the P-type Si substrate into a porous substrate by anodization in an HF solution, shielding the Si islands from the surface, and then subjecting the N-type Si islands to dielectric isolation by accelerated oxidation. This technique is, however, accompanied by a problem that the isolated Si region is defined before the process of producing devices thereby restricting freedom of device design.

The oxygen ion implantation method is also referred to as the SIMOX method, which was proposed by K. Izumi for the first time. With this technique, oxygen ions are implanted into an Si wafer to a concentration level of $10^{17}$ to $10^{18}$/cm$^2$ and then the latter is annealed at high temperature of about 1,320° C. in an argon/oxygen atmosphere. As a result, the implanted oxygen ions are chemically combined with Si atoms to produce a silicon oxide layer that is centered at a depth corresponding to the projection range (Rp) of the implanted ions. Under this condition, an upper portion of the Si oxide layer that is turned into an amorphous state by the oxygen ion implantation is recrystallized to produce a single crystal Si layer. While the surface Si layer used to show a defect rate as high as $10^5$/cm$^2$, a recent technological development has made it possible to reduce the defect rate down to about $10^5$/cm$^2$ by selecting a rate of oxygen implantation of about $4\times10^{17}$/cm$^2$. However, the allowable range of energy infusion and that of ion implantation are limited if the film quality of the Si oxide layer and the crystallinity of the surface Si layer are to be held to respective desired levels and hence the film thickness of the surface Si layer and that of the buried Si oxide (BOX; buried oxide) layer are allowed to take only limited values. In other words, a process of sacrifice oxidation or epitaxial growth is indispensable to realize a surface Si layer having a desired film thickness. Such a process in turn gives rise to a problem of uneven film thickness due to the intrinsic adverse effect of the process.

There have been reports saying that SIMOX can produce defective Si oxide regions in the Si oxide layer that are referred to as pipes. One of the possible causes of the phenomenon may be foreign objects such as dust introduced into the layer at the time of ion implantation. The device produced in a pipe region can show degraded characteristics due to the leak current between the active layer and the underlying substrate.

The SIMOX technique involves the use of a large volume of ions that is by far greater than the volume used in the ordinary semiconductor process and hence the ion implantation process may take a long time if a specifically designed apparatus is used for it. Since the ion implantation process is performed typically by means of raster scan of an ion beam showing a predetermined flow rate of electric current or by spreading an ion beam, a long time may be required for processing a large wafer. Additionally, when a large wafer is processed at high temperature, the slip problem due to an uneven temperature distribution within the wafer can become very serious. Since the SIMOX process requires the use of extraordinarily high temperature that is as high as 1,320° C. which is not observed in the ordinary Si semiconductor process, the problem of uneven temperature distribution will become more serious if a large wafer has to be prepared unless a highly effective apparatus is realized.

Beside the above described known techniques of forming SOI, a technique of bonding a single crystal Si substrate to another single crystal Si substrate that has been thermally oxized to produce an SOI structure has been proposed recently. This method requires the use of an active layer having an even thickness for the devices to be formed on it. More specifically, a single crystal Si substrate that is as thick as several hundred micrometers has to be made as thin as several micrometers or less. Three techniques have been known for thinning a single crystal Si layer that include;

(1) polishing,
(2) local plasma etching and
(3) selective etching.

It is difficult to achieve an even film thickness by means of the polishing technique of (1) above. Particularly, the mean deviation in the film thickness can be as large as tens of several percent to make the technique unfeasible when the film is thinned to an order of sub-micrometer. This problem will become more remarkable for wafers having a large diameter.

The technique of (2) is typically used in combination with that of (1). More specifically, the film is thinned by means of the technique of (1) to about 1 to 3 $\mu$m and the distribution of film thickness is determined by observing the film thickness at a number of points. Then, the film is subjected to an etching operation where the film is scanned with plasma of $SF_6$ particles having a diameter of several millimeters, correcting the distribution of film thickness, until a desired film thickness is obtained. There has been a report that the distribution of film thickness can be confined within about ±10 nm or less by means of this technique. However, this process is accompanied by a drawback that, if foreign objects are present on the substrate in the form of particles during the plasma etching, they operate as etching masks to produce projections on the substrate when the etching operation is over.

Additionally, since the substrate shows a coarse surface immediately after the etching operation, a touch-polishing operation has to be conducted on the surface after the end of the plasma etching and the operation is controlled only in terms of its duration. Then, again the problem of deviations in the film thickness due to polishing arises. Still additionally, a polishing agent typically containing colloidal silica is used for the polishing operation and hence the layer for making an active layer is directly scraped by the polishing agent so that a crushed and/or distorted layer may be produced. The throughput of the process can be significantly reduced when large wafers are treated because the duration of the plasma etching operation is prolonged as a function of the surface area of the wafer being processed.

The technique of (3) involves the use of a film configuration for the substrate to be thinned that comprises one or more than one film layers adapted to selective etching. For example, assume that a $P^+$-Si thin layer containing boron by more than $10^{19}/cm^3$ and a P-type Si thin layer are made to grow sequentially on a P-type substrate by means of epitaxial growth to produce a first substrate, which is then bonded to a second substrate with an insulation layer interposed therebetween, the insulation layer being typically an oxide film, and that the rear surface of the first substrate is made sufficiently thin in advance by scraping and polishing. Subsequently, the $P^+$-layer is exposed by selectively etching the overlying P-type layer and then the P-type substrate is exposed by selectively etching the $P^+$-layer to produce an SOI structure. This technique is discussed in detail in a report by Maszara (W. P. Maszara, J. Electrochem. Soc., Vol. 138,341 (1991)).

While the selective etching technique is effective for producing a thin film with an even film thickness, it is accompanied by the drawbacks as identified below.

The selective etching ratio is not satisfactory and will be as low as $10^2$ at most.

A touch-polishing operation is required to smooth the surface after the etching operation because of the coarse surface produced by the etching operation. Therefore, the film thickness can lose the uniformity as it is reduced by polishing. Particularly, while the polishing operation is controlled by the duration of the operation, it is difficult to rigorously control the operation because the polishing rate can vary significantly from time to time. Thus, this problem becomes non-negligible when forming an extremely thin SOI layer that is as thin as 100 nm.

The produced SOI layer can show a poor crystallinity due to the use of a film forming technique that involves ion implantation and epitaxial or hetero-epitaxial growth on an Si layer that is densely doped with B. Additionally, the bonded surface of the substrate may show a degree of smoothness that is inferior relative to that of a conventional Si wafer (C. Harendt, et al., J. Elect. Mater. Vol. 20,267 (1991), H. Baumgart, et al., Extended Abstract of ECS first International Symposium of Wafer Bonding, pp-733 (1991), C. E. Hunt, Extended Abstract of ECS first International Symposium of Wafer Bonding, pp-696 (1991)). Still additionally, there is a problem that the selectivity of the selective etching technique heavily depends on the concentration difference among the impurities such as boron contained in the substrate and the steepness of the concentration profile of the impurities along the depth of the substrate. Therefore, if the bonding anneal is conducted at high temperature to improve the bonding strength of the layers and the epitaxial growth is carried out also at high temperature to enhance the crystallinity of the SOI layer, the concentration profile of the impurities along the depth becomes flattened to reduce the selectivity of the etching operation. Simply stated, the improvement of the etching selectivity and hence that of the crystallinity and the improvement of the bonding strength are conflicting requirements that cannot be met at the same time.

Under these circumstances, the inventors of the present invention proposed a novel method of manufacturing a semiconductor article in Japanese Patent Application Laid-Open No. 5-21338. According to the invention, the proposed method comprises the steps of forming an article by arranging a nonporous single crystal semiconductor region on a porous single crystal semiconductor region, bonding the surface of a material carrying an insulating material thereon to the corresponding surface of said porous single crystal semiconductor region and subsequently removing said porous single crystal semiconductor region by etching.

T. Yonehara et al. who are the inventors of the present invention also reported a bonded SOI that is excellent in terms of even film thickness and crystallinity and adapted to batch processing (T. Yonehara et al., Appl. Phys. Lett. Vol. 64,2108 (1994)). Now, the proposed method of manufacturing a bonded SOI will be summarily described below by referring to FIGS. 3A through 3C of the accompanying drawings.

The proposed method uses a porous layer 42 formed on a first Si substrate 41 as a layer to be selectively etched. After forming a nonporous single crystal Si layer 43 on the porous layer 42 by epitaxial growth, it is bonded to a second substrate 44 with an Si oxide layer 45 interposed therebetween (FIG. 4A). Then, the porous Si layer is exposed over the entire surface area of the first substrate by scraping off the first substrate from the rear side (FIG. 4B). The exposed porous Si is then etched out by means of a selective etching solution typically containing KOH or HF+$H_2O_2$ (FIG. 4C). Since the selective etching ratio of the operation of etching the porous Si layer relative to the bulk Si layer (nonporous single crystal Si layer) can be made as high as hundreds of thousands with this technique, the nonporous single crystal Si layer formed on the porous layer in advance can be transferred onto the second substrate to produce an SOI substrate without reducing the thickness of the nonporous single crystal Si layer. Thus, the uniformity of the film thickness of the SOI substrate is determined during the epitaxial growth step. According to a report by Sato et al., since a CVD system adapted to an ordinary semiconductor process can be used for the epitaxial growth, a degree of uniformity of the film thickness as high as 100 nm±2% can be realized. Additionally, the epitaxial Si layer shows an excellent crystallinity of about $3.5 \times 10^2/cm^2$.

Since the selectivity of any conventional selective etching technique heavily depends on the concentration difference among the impurities contained in the substrate and the steepness of the concentration profile of the impurities along the depth of the substrate as described above, the temperature of the heat treatment (for bonding, epitaxial growth, oxidation and so on) is limited to as low as 800° C. at most because the impurity concentration profile becomes flattened above that temperature limit. On the other hand, the etching rate of the proposed etching technique is mainly determined by the structural difference between the porous layer and the bulk layer so that the heat treatment is not subjected to such a rigorous limitation and temperature as high as 1,180° C. can be used. It is known that a heat treatment process conducted after the bonding operation can remarkably improve the bonding strength between wafers and reduce the size and number of voids given rise to on the bonding interface. Additionally, with a selective etching operation relying on the structural difference between the porous layer and the bulk layer, the uniformity of the film thickness is not adversely affected by fine particles that can be adhering to the porous Si layer.

However, a semiconductor substrate to be produced by way of a bonding process inevitably requires at least two wafers as starting materials, one of which is substantially wasted away in the course of polishing and etching to consume the limited natural resources almost for nothing. In other words, an SOI manufacturing process is required to realize low cost and economic feasibility in addition to an enhanced degree of process controllability and an improved uniformity of the film thickness.

Differently stated, the requirements of a process for manufacturing a high quality SOI substrate include an excellent reproducibility, an enhanced level of resource saving capability through the repeated use of a same wafer and low manufacturing cost.

Under such circumstances, the inventors of the present invention disclosed, in Japanese Patent Application Laid-Open No. 7-302889, a process for producing a semiconductor substrate in which two substrates are bonded together and the bonded substrates are separated at the porous layer and the separated one substrate is reused after eliminating the remaining porous layer. An example of this disclosed process is explained by reference to FIGS. 5A to 5C.

A surface layer of a first Si substrate 51 is made porous to form porous layer 52, and thereon single crystal Si layer 53 is formed. This single crystal Si layer on the first Si substrate is bonded to the main face of second Si substrate 54 with interposition of insulation layer 55 (FIG. 5A). Then the wafer is separated at the porous layer (FIG. 5B). The bared porous Si layer on the second substrate surface is removed selectively to form an SOI substrate (FIG. 5C). First substrate 51 can be used again after removal of the porous layer.

In the above process disclosed in Japanese Patent Application Laid-Open No. 7-302889, the substrates are separated by utilizing the brittleness of the porous silicon layer in comparison with the nonporous silicon layer, enabling reuse of the substrate once used for semiconductor substrate production process to lower the production cost.

Japanese Patent Application Laid-Open No. 8-213645 discloses a process in which a semiconductor layer is formed, on a porous silicon layer, for a photoelectric conversion portion of a solar cell and the semiconductor layer is later separated at the porous layer to reuse the substrate having the porous silicon layer.

On the other hand, Japanese Patent Application Laid-Open No. 5-211128 discloses another process for separation of a substrate without employing such a porous silicon layer. In this process, a bubble layer is formed in a silicon substrate by ion implantation, crystal rearrangement and bubble coalescence are caused in the bubble layer by heat treatment, and the surface region of the silicon substrate (called a thin semiconductor film) is stripped off at the bubble layer. The thin semiconductor film in this disclosure means an outermost region of a bulk Si where no or few implanted ions are present. However, bulk Si wafers are known to have inherent defects such as flow pattern defects (T. Abe: Extended Abst. Electrochem. Soc. Spring Meeting, Vol.95-1, pp.596 (May, 1995)) and crystal originated particles (H. Yamamoto: "Problems in Large-Diameter Silicon Wafer", 23th Ultra Clean Technology Collage (August, 1996). Therefore, the thin semiconductor film naturally has the flow pattern defects or the crystal originated particles.

If the semiconductor film can be separated from the silicon substrate without the flow pattern defects or the crystal-originated particles, practically useful semiconductor material can be provided at low cost differently from the aforementioned processes employing the porous silicon. In view of the above problems, after comprehensive investigations, the present invention has been accomplished.

SUMMARY OF THE INVENTION

An object of the present invention is to provide a process for producing a semiconductor article comprising a step of bonding two substrates where a part of the substrate is reused as the material for the semiconductor article.

According to an aspect of the present invention, there is provided a process for producing a semiconductor article comprising the steps of preparing a first substrate comprised of a silicon substrate, a nonporous semiconductor layer formed on the silicon substrate, and an ion implantation layer formed in at least one of the silicon substrate and the nonporous semiconductor layer; bonding the first substrate to a second substrate to obtain a multiple layer structure with the nonporous semiconductor layer placed inside; separating the multiple layer structure at the ion implantation layer; and removing the ion implantation layer remaining on the separated second substrate.

According to another aspect of the present invention, there is provided a process for producing a semiconductor article comprising the steps of preparing a first substrate comprised of a silicon substrate, a nonporous semiconductor layer formed on the silicon substrate, and an ion implantation layer formed in at least one of the silicon substrate and the nonporous semiconductor layer; bonding the first substrate to a second substrate to obtain a multiple layer structure with the nonporous semiconductor layer placed inside; separating the multiple layer structure at the ion implantation layer; removing the ion implantation layer remaining on the separated second substrate; and reusing the first substrate, after removal of the remaining ion implantation layer therefrom, as a first substrate material.

According to a further aspect of the present invention, there is provided a process for producing a semiconductor article comprising steps of preparing a first substrate comprised of a silicon substrate, a nonporous semiconductor layer formed on the silicon substrate, and an ion implantation layer formed in at least one of the silicon substrate and the nonporous semiconductor layer; bonding the first substrate to a second substrate to obtain a multiple layer structure with the nonporous semiconductor layer placed inside; separating the multiple layer structure at the ion implantation layer; removing the ion implantation layer remaining on the separated second substrate; and reusing the first substrate, after removal of the remaining ion implantation layer therefrom, as a second substrate material.

In the process for producing a semiconductor article, the first substrate has a nonporous semiconductor layer for bonding. The nonporous semiconductor layer is preferably constituted of an epitaxial semiconductor layer. With this nonporous semiconductor layer, high-quality semiconductor article can be provided without the flow pattern defects or crystal originated particles inherent to the silicon wafer as mentioned above. Since the nonporous semiconductor layer can be controlled readily in electroconductivity type and impurity concentration, the process for producing a semiconductor article of the present invention satisfies various demands and is applicable in various uses.

The multiple layer structure obtained by bonding the first substrate and the second substrate together is separated at the ion implantation layer, and the remaining silicon substrate of the first substrate can be reused as the construction member of the first substrate or the second substrate, which is advantageous in resource saving and cost reduction.

The present invention provides a process for producing a semiconductor article excellent in productivity, controllability, and low cost for the formation of a single crystal semiconductor layer having high crystallinity on a second substrate comprised of an insulating substrate, or the like.

DESCRIPTION OF THE PREFERRED EMBODIMENTS

Figure 1A:
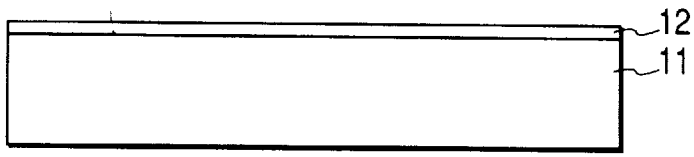
FIGS. 1A, 1B, 1C, 1D and 1E are schematic sectional views for explaining the process of Embodiment 1 of the present invention.

The present invention is described below by reference to embodiments. The present invention is not limited thereto provided that the object of the present invention is attained.

[Ion Implantation Layer]

Implantation of helium ions or hydrogen ions to a single crystal silicon substrate forms micro-cavities of several to tens of nanometers in diameter in the implantation region in the substrate at a micro-cavity density of as high as $10^{16}$–$10^{17}$/cm$^2$. Thereby, the silicon substrate comes to have a structure like a porous layer. The ions employed in the ion implantation in the present invention are selected from the ions of rare gas elements, hydrogen, and nitrogen. In the present invention, the ion implantation layer is formed in at least one of the silicon substrate and the nonporous semiconductor layer provided on the silicon substrate, or may be formed at the interface between them. Two or more ion implantation layers may be formed. The dose of the ion implantation for the ion implantation layer is preferably in the range of from $10^{16}$ to $10^{17}$/cm$^2$ in consideration of the layer separation of the multiple layer structure formed by bonding of the first substrate and the second substrate. The thickness of the ion implantation layer depends on the acceleration voltage, and is generally not more than 500 Å, preferably not more than 200 Å in consideration of the uniformity of the thickness of the nonporous semiconductor layer on the second substrate after layer separation of the multiple layer structure. The concentration of the implanted ions in the implantation layer distributes in the layer thickness direction. The layer separation of the multiple layer structure tends to be caused along the highest ion concentration plane level.

[Nonporous Semiconductor Layer]

The nonporous semiconductor layer in the present invention is formed preferably from a material selected from single crystal Si, polycrystalline Si, amorphous Si, and compound semiconductors such as GaAs, InP, GaAsP, GaAlAs, InAs, AlGaSb, InGaAs, ZnS, CdSe, CdTe, and SiGe, and the like. Into the nonporous semiconductor layer, a semiconductor element such as FET (field effect transistor) may be preliminarily incorporated.

[First Substrate]

The first substrate in the present invention is a substrate comprised of a silicon substrate, a nonporous semiconductor layer provided on the silicon substrate, and an ion implantation layer formed in at least one of the silicon substrate and the nonporous semiconductor layer. Therefore, the first substrate includes not only substrates comprised of a silicon substrate having an ion implantation layer formed therein and a nonporous semiconductor layer, but also substrates having additionally an insulation layer such as a nitride film and an oxide film, substrates having an epitaxial semiconductor layer and an insulation layer formed on a silicon substrate and an ion implantation layer formed by subsequent ion implantation into the silicon substrate, substrates having a nonporous semiconductor layer formed on the silicon substrate and an ion implantation layer formed by subsequent ion implantation, and the like substrates.

The nonporous semiconductor layer on the silicon substrate may be formed by CVD such as low pressure CVD, plasma CVD, photo-assisted CVD, and MOCVD (metal organic CVD), sputtering (including bias sputtering), molecular beam epitaxial growth, liquid phase growth, or a like method.

[Second Substrate]

The second substrate onto which the nonporous semiconductor layer is to be transferred includes semiconductor substrates such as single crystal silicon substrates, substrates having an insulation film such as an oxide film (including thermal oxidation film) and a nitride film, light-transmissive substrates such as a silica glass substrate and a glass substrate, metal substrates, insulating substrate such as alumina, and like substrates. The second substrate is selected suitably depending on the application field of the semiconductor article.

[Bonding]

The aforementioned first substrate in the present invention is bonded to a second substrate to obtain a multiple layer structure with the nonporous semiconductor layer placed inside. The multiple layer structure having a nonporous semiconductor layer placed inside, in the present invention, includes not only the structures in which the nonporous semiconductor layer of the first substrate is bonded directly to the second substrate but also the structures in which an oxide film, a nitride film, or the like formed on the surface of the nonporous semiconductor layer surface is bonded to the second substrate. That is, the structure having a nonporous semiconductor layer placed inside means a multiple layer structure in which the nonporous semiconductor layer is placed inside the porous silicon layer in the multiple layer structure.

The first substrate and the second substrate can be bonded together, for example, at room temperature by making both bonding faces flat and bringing both into close contact with each other. Anode bonding, pressing, or heat treatment may be employed for stronger bonding.

[Layer Separation of Multiple Layer Structure]

The multiple layer structure is separated into layers at the ion implantation layer in the present invention. The ion implantation layer has micro-cavities or fine bubbles therein, and is fragile in comparison with the other regions. Therefore the separation can be conducted effectively by utilizing the fragility. Specifically, the separation can be conducted by application of external force to the ion implanted layer. Otherwise the separation can be conducted by oxidizing the ion implantation layer from the periphery of the wafer to the interior by utilizing the accelerated oxidation of the porous portion of the ion implantation layer to cause volume expansion of the layer to result in layer separation by expansion force.

The ion implantation layer is usually covered also in the peripheral portion with the nonporous layer. The peripheral portion or the end face of the ion implantation layer should be bared before or after the bonding. When the bonded substrates are subjected to oxidation, the oxidation reaction which is accelerated by the large surface area of the pores will proceed from the periphery of the ion implantation layer. By oxidation of Si to $SiO_2$, the volume increases by a factor of 2.27. Therefore, at the porosity of not more than 56%, the volume of the oxidized ion implantation layer will increase. The degree of the oxidation becomes smaller gradually from the periphery to the interior to make the volume expansion larger at the oxidized ion implantation layer in the periphery, as if a wedge is driven from the end face of the wafer into the ion implantation layer. Thereby, an internal pressure is applied to the ion implantation layer to cause layer separation at the ion implantation layer. Since the oxidation reaction proceeds uniformly at the peripheral portion of the wafer, the separation is caused uniformly from the periphery of the wafer to separate the multiple layer structure. By this method, the wafer can be separated uniformly with satisfactory control by utilizing oxidation of a usual step of an Si-IC process.

The multiple layer structure can also be separated into layers by applying heat to produce thermal stress at the fragile ion implantation layer.

The multiple layer structure can also be separated into layers by local heating without heating the entire multiple layer structure by use of laser which is capable of heating an intended layer only. Therefore the separation can be conducted by use of a laser beam which is absorbed by the porous ion implantation layer or the vicinity thereof for local heating.

The multiple layer structure can also be separated into layers by heating quickly the porous ion implantation layer or the vicinity thereof by applying electric current.

[Removal of Porous Layer]

After the layer separation at the ion implantation layer of the multiple layer structure derived by bonding of the first substrate and the second substrate, the ion implantation layer remaining on the substrate can be removed selectively by utilizing the low mechanical strength or the large surface area of the ion implantation layer. The selective removal method includes mechanical methods such as polishing or grinding, chemical etching methods employing an etching solution, and ion etching methods such as reactive ion etching.

When the nonporous thin film is a single crystal Si, the ion implantation layer can be etched off selectively by use of at least one of a usual Si etching solution, a hydrofluoric acid solution, a solution mixture of a hydrofluoric acid solution and at least one of an alcohol and a hydrogen peroxide solution, a buffered hydrofluoric acid solution, and a solution mixture of a buffered hydrofluoric acid solution and at least one of an alcohol and a hydrogen peroxide solution. When the nonporous semiconductor layer is composed of a compound semiconductor, the ion implantation layer can be etched off by use of an etching solution which is capable of etching Si at a higher rate than the compound semiconductor.

The embodiments of the present invention are described below in reference to drawings.

EMBODIMENT 1

FIGS. 1A to 1E are schematic sectional views showing the steps of Embodiment 1 of the present invention.

Firstly, on a main surface of first substrate 11 of single crystal Si, at least one nonporous layer 12 is formed (FIG. 1A). Single crystal Si substrate 11 may be a wafer of non-designated resistance or a usual regenerated wafer since the properties of the produced SOI substrate depend on nonporous layer 12. Additionally, $SiO_2$ layer 13 may be formed as the outermost layer. This $SiO_2$ layer may serve to deviate the bonding interface from the active layer.

Figure 1B:
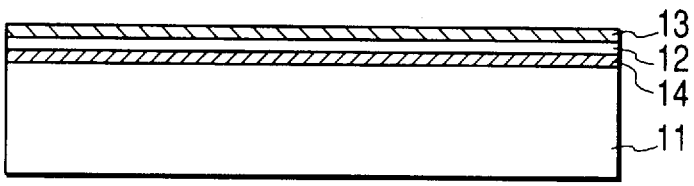

The ions are implanted from the main surface of first substrate by employing at least one kind of elements of rare gas elements, hydrogen, and nitrogen (FIG. 1B). Ion accumulation layer 14 is formed preferably in the vicinity of the interface between first single crystal substrate 11 and nonporous layer 12 or in nonporous layer 12.

Figure 1C:
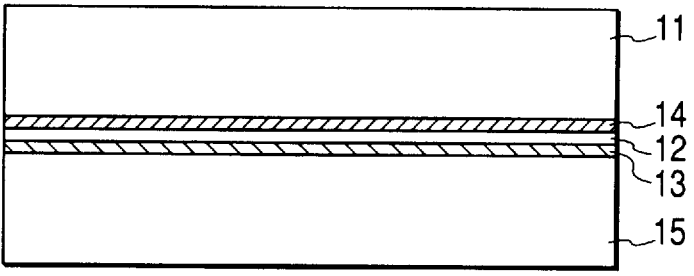

The surface of second substrate 15 is brought into close contact with the surface of the first substrate, for example, at room temperature (FIG. 1C).

When single crystal Si is deposited, the surface of the single crystal Si is preferably oxidized before the bonding by thermal oxidation or a like method. In FIG. 1C, the second substrate and the first substrate are bonded together with insulation layer 13 placed inside. This insulation layer 13 may be omitted when nonporous thin film 12 is not composed of Si, or the second substrate is not composed of Si.

In bonding, a thin insulation plate may be interposed and the three layers may be bonded in superposition.

Figure 1D:
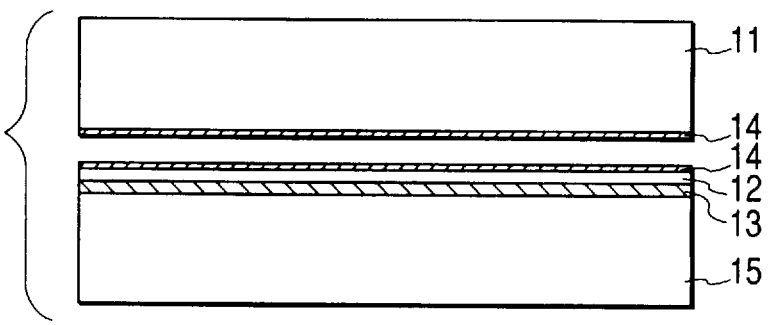

The substrates are then separated at the ion accumulation layer 14 (FIG. 1D). The method of the separation includes application of external force such as pressing, pulling, shearing, and wedging; application of heat; application of internal pressure by expansion of the porous Si by oxidation from the periphery; application of thermal stress by pulse heating; and softening, but is not limited thereto.

From the separated substrates, the ion accumulation layer 14 is selectively removed respectively by the method mentioned before.

Figure 1E:
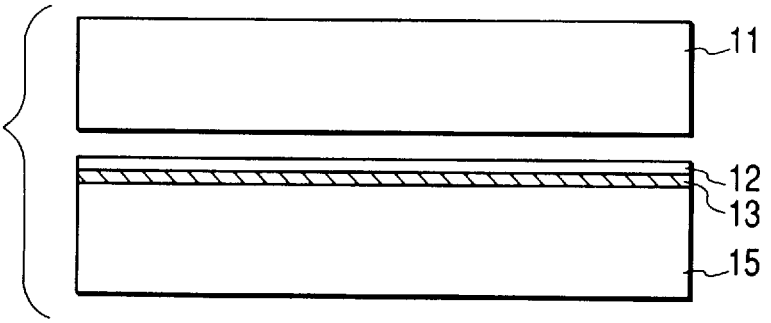

FIG. 1E shows a semiconductor article prepared according to the present invention. On second substrate 15, nonporous thin film 12, such as thin single crystal Si film, is formed uniformly over the entire wafer. A semiconductor article prepared through the step of bonding the second substrate to the first substrate by interposition of insulation layer 13 is useful in view of the production of insulated electronic elements.

The substrate 11 can be reused as the first single crystal Si substrate 11, or the second substrate 15. When the surface of single crystal Si substrate 11 after the removal of the remaining ion accumulation layer 14 is unacceptably rough, the substrate is treated for surface flattening before the reuse.

For reuse as first single crystal Si substrate 11, the decrease of the thickness caused by the layer separation and the surface treatment is supplemented with an epitaxial layer. Thereby, the substrate can be used semipermanently without wafer thickness loss.

EMBODIMENT 2

FIGS. 2A to 2E are schematic sectional views showing the steps of Embodiment 2 of the present invention.

Figure 2A:
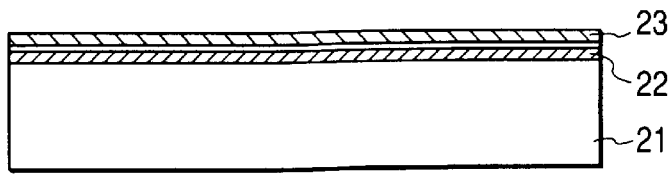
FIGS. 2A, 2B, 2C, 2D and 2E are schematic sectional views for explaining the process of Embodiment 2 of present invention.
Figure 2B:
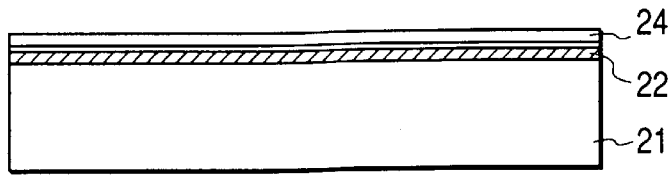

A first single crystal Si substrate 21 is provided. Ions are implanted from the main face of the first substrate by employing at least one kind of elements of rare gas elements, hydrogen, and nitrogen to form ion accumulation layer 22 inside (FIG. 2A). $SiO_2$ layer 23 is preferably formed before the ion implantation to prevent surface roughening by ion implantation. After removal of $SiO_2$ layer 23, at least one nonporous layer 24 is formed on the main face (FIG. 2B).

Figure 2C:
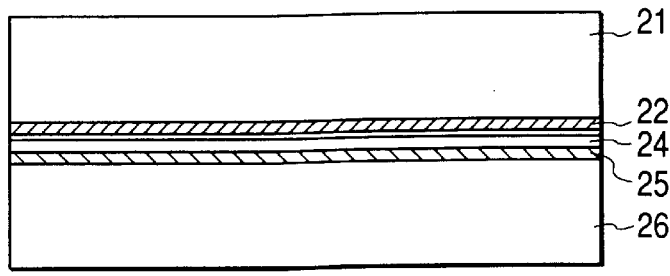

The face of second substrate 15 is brought into close contact with the face of the first substrate, for example, at room temperature (FIG. 2C).

When single crystal Si is deposited, the surface of the single crystal Si is preferably oxidized before the bonding by thermal oxidation or a like method. In FIG. 2C, the second substrate and the first substrate are bonded together with interposition of insulation layer 25. This insulation layer 25 may be omitted when nonporous thin film 24 is not composed of Si, or the second substrate is not composed of Si.

In bonding, a thin insulation plate may be interposed and the three layers may be bonded in superposition.

Figure 2D:
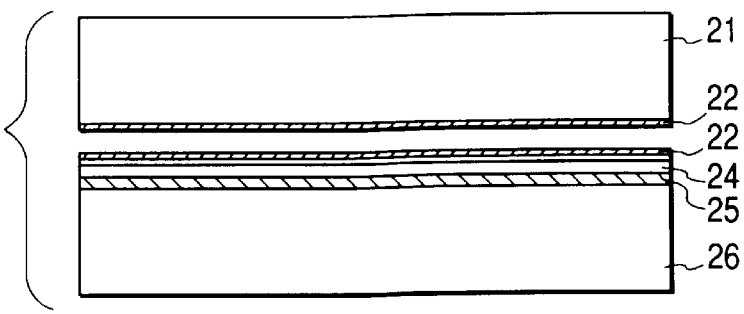

The substrates are then separated at the ion accumulation layer 22 (FIG. 2D).

Ion accumulation layer 22 is selectively removed from the separated substrates respectively.

Figure 2E:
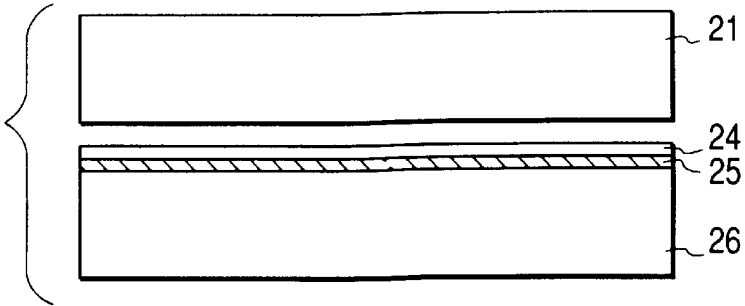

FIG. 2E shows a semiconductor article prepared according to the present invention. On second substrate 26, nonporous thin film 24, such as thin single crystal Si film, is formed uniformly over the entire wafer. A semiconductor article prepared through the steps of bonding the second substrate to the first substrate by interposition of insulation layer 25 is useful in view of the production of insulated electronic elements.

The substrate 21 can be reused as the first single crystal Si substrate 21, or the second substrate 26. When the surface of single crystal Si substrate 21 after the removal of the remaining ion accumulation layer 22 is unacceptably, rough the substrate is treated for surface flattening before the reuse.

EMBODIMENT 3

Figure 3A:
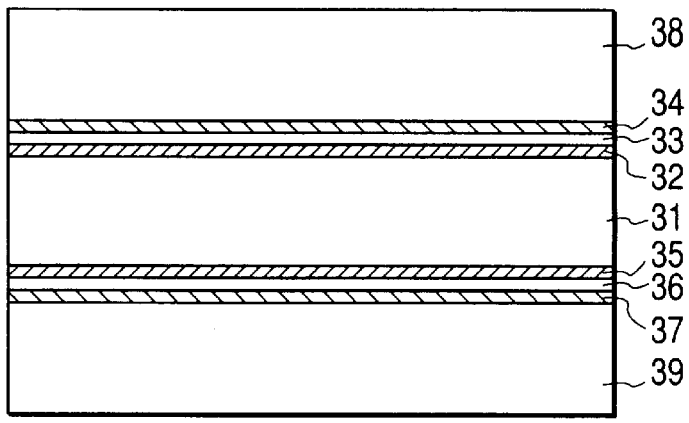
FIGS. 3A, 3B and 3C are schematic sectional views for explaining the process of Embodiment 3 of the present invention.
Figure 3B:
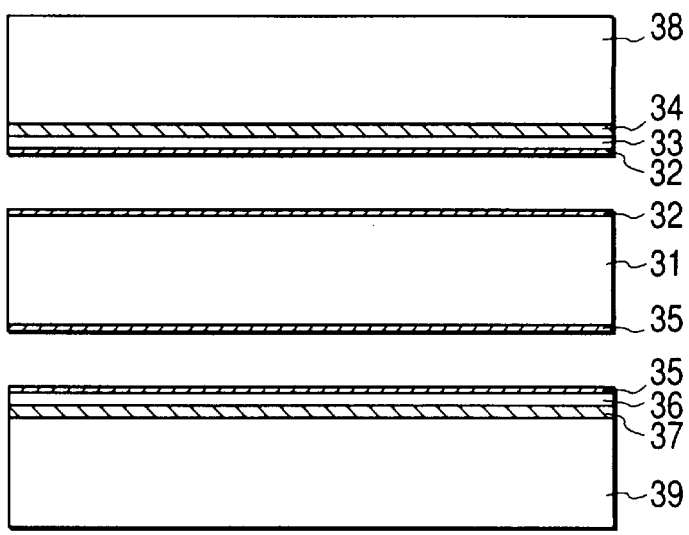
Figure 3C:
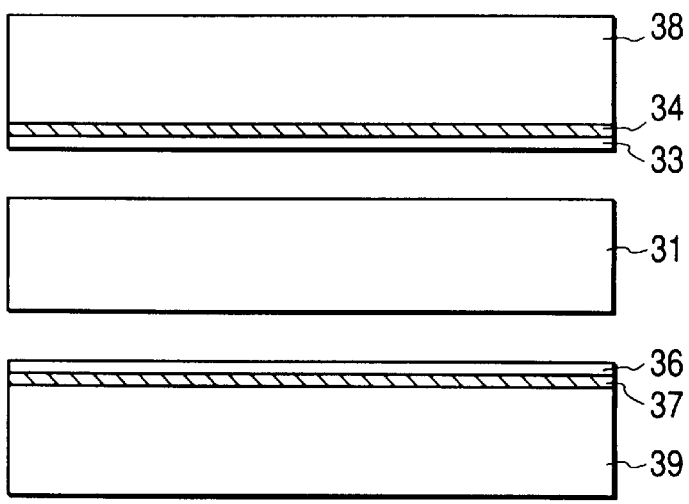
Figure 4A:
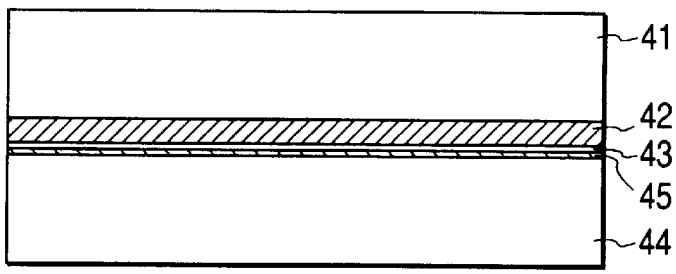
FIGS. 4A, 4B and 4C are schematic sectional views for explaining the process of a prior art process.
Figure 4B:
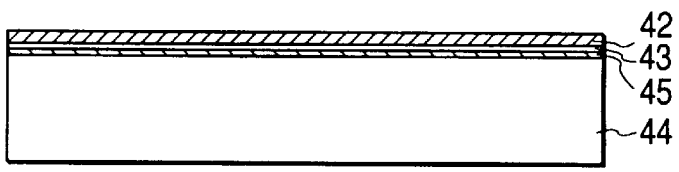
Figure 4C:
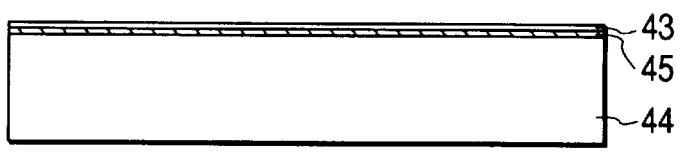
Figure 5A:
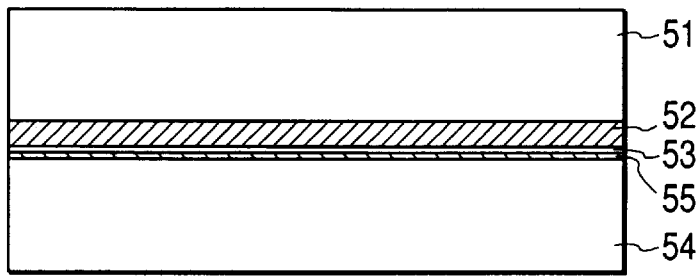
FIGS. 5A, 5B and 5C are schematic sectional views for explaining the process of another prior art process.
Figure 5B:
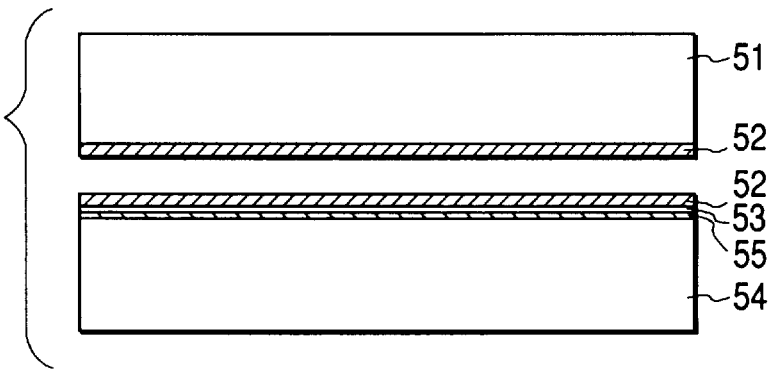
Figure 5C:
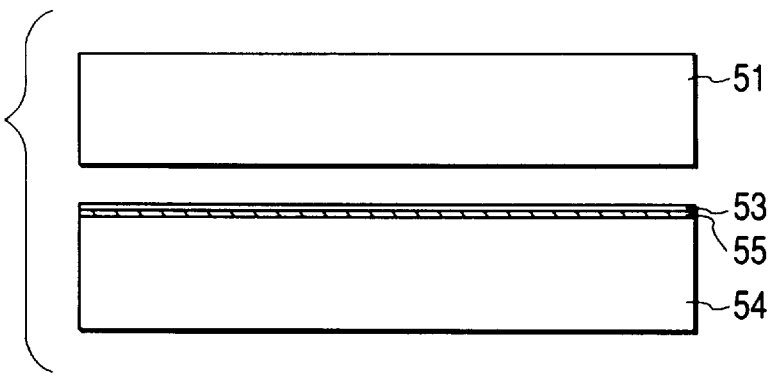

FIGS. 3A to 3C are schematic sectional views showing the steps of Embodiment 3 of the present invention.

As shown in FIGS. 3A to 3C, two semiconductor substrates are prepared simultaneously by employing two second substrates and treating the both faces of the first substrate as shown in Embodiment 1 and Embodiment 2.

In FIGS. 3A to 3C, the numeral 31 denotes a first substrate; 32 and 35, a porous layer; 33 and 36, a nonporous thin film; 34 and 37, an $SiO_2$ layer; and 38 and 39, a second substrate. FIG. 3A shows first substrate 31 treated on both faces as in Embodiment 1, and second substrates 38,39 bonded to the faces of first substrate 31. FIG. 3B shows the state after the separation at porous layers 32,35 in the same manner as in Embodiment 1. FIG. 3C shows the state after removal of porous layers 32,35.

The substrate 21 can be reused as the first single crystal Si substrate 31, or the second substrate 38 (or 39). When the surface of first single crystal Si substrate 21 after the removal of the remaining ion accumulation layer is unacceptably rough the substrate is treated for surface flattening before the reuse.

Supporting substrates 38,39 may be different from each other. Nonporous thin layers 33,36 may be different from each other. Insulation layers 34,37 may be omitted.

The present invention is explained specifically by reference to Examples.

EXAMPLE 1

On a crystal Si substrate (first substrate), single crystal Si was grown epitaxially in a thickness of 0.30 µm by CVD (chemical vapor deposition) under the growth conditions below.

Source gas: $SiH_2Cl_2/H_2$

Gas flow rate: 0.5/180 L/min

Gas pressure: 80 Torr

Temperature: 950° C.

Growth rate: 0.30 µm/min

On the surface of this epitaxial Si layer, an $SiO_2$ layer was formed in a thickness of 200 nm by thermal oxidation. Then $H^+$ was implanted through the $SiO_2$ surface layer at 40 keV at a dose of $5 \times 10^{16}$ $cm^{-2}$.

The face of the $SiO_2$ layer is brought into contact with the face of another Si substrate (second substrate), and the bonded substrates were annealed at 600° C. By the annealing, the bonded substrates came to be separated into two sheets at around the projection range of the ion implantation owing to porous structure of the ion implantation layer. The surfaces of the separated substrates were rough. The surface of the second substrate was selectively etched by a mixture of 49% hydrofluoric acid and aqueous 30% hydrogen peroxide. Thereby the ion implantation layer was completely etched off with the single crystal Si remaining unetched as the etch-stopping material.

Since the nonporous single crystal Si is etched extremely slowly, the decrease of the film thickness thereof is practically negligible (about several tens of Ångstroms).

Thus, a single crystal Si layer of 0.2 μm thick was formed on the Si oxide film. The thickness of the formed single crystal Si layer was measured at 100 points over the entire layer, and the uniformity of the layer thickness was found to be 201 nm ±6 nm.

The substrate having the single crystal Si layer transferred thereon was heat treated at 1100° C. for one hour in a hydrogen atmosphere. The surface roughness was about 0.2 nm in terms of average square roughness for a 50 μm square region as measured by interatomic force microscopy. This is the same level as that of the commercial Si wafer.

No crystal defect was found to be introduced additionally into the Si layer, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate or the second substrate.

For reuse as the first substrate, the decrease of the wafer thickness was supplemented by epitaxial layer growth. Thus the substrate was made reusable semipermanently. In the second or later use, the epitaxial layer growth thickness is not 0.30 μm, but corresponds to the thickness decrease, and the ion implantation layer is formed inside the epitaxial layer.

EXAMPLE 2

On a single crystal Si substrate (first substrate), single crystal Si was grown epitaxially in a thickness of 0.50 μm by CVD (chemical vapor deposition) under the growth conditions below.

Source gas: $SiH_2Cl_2/H_2$

Gas flow rate: 0.5/180 L/min

Gas pressure: 80 Torr

Temperature: 950° C.

Growth rate: 0.30 μm/min

Then $H^+$ was implanted through the epitaxial layer on the surface at 50 keV at a dose of $6 \times 10^{16}$ cm$^{-2}$.

The face of the epitaxial layer is brought into contact with the face of another Si substrate (second substrate) having an $SiO_2$ layer of 500 nm thick formed thereon, and the bonded substrates were annealed at 550° C. By the annealing, the bonded substrates came to be separated into two sheets at around the projection range of the ion implantation. The surfaces of the separated substrates were rough. The surface of the second substrate was selectively etched by a mixture of 49% hydrofluoric acid and aqueous 30% hydrogen peroxide with stirring. Thereby the ion implantation layer was completely etched off with the single crystal Si remaining unetched as the etch-stopping material.

The nonporous single crystal Si is etched extremely slowly, and the decrease of the film thickness is practically negligible (about several tens of Ångstroms).

The surface was flattened by polishing.

Thus, a single crystal Si layer of 0.5 μm thick was formed on the Si oxide film. The thickness of the formed single crystal Si layer was measured at 100 points over the entire layer, and the uniformity of the film thickness was found to be 498 nm ±15 nm.

The surface roughness was about 0.2 nm in terms of average square roughness for a 50 μm square region as measured by interatomic force microscopy. This is the same level as that of the commercial Si wafer.

No crystal defect was found to be introduced additionally into the Si layer, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate or the second substrate.

For reuse as the first substrate, the decrease of the wafer thickness was supplemented by epitaxial layer growth. Thus the substrate was made reusable semipermanently. In the second use or later, the epitaxial layer growth thickness is not 0.50 μm but corresponds to thickness decrease, and the ion implantation layer is formed inside the epitaxial layer.

EXAMPLE 3

On a single crystal Si substrate (first substrate), single crystal Si was grown epitaxially in a thickness of 0.30 μm by CVD (chemical vapor deposition) under the growth conditions below.

Source gas: $SiH_2Cl_2/H_2$

Gas flow rate: 0.5/180 L/min

Gas pressure: 80 Torr

Temperature: 950° C.

Growth rate: 0.30 μm/min

On the surface of this epitaxial Si layer, an $SiO_2$ layer was formed in a thickness of 200 nm by thermal oxidation. Then $H^+$ was implanted through the $SiO_2$ layer surface at 40 keV at a dose of $5 \times 10^{16}$ cm$^{-2}$.

The face of the $SiO_2$ layer is brought into contact with the face of another Si substrate (second substrate) having an $SiO_2$ layer of 500 nm thick formed thereon, and the bonded substrates were annealed at 600° C. By the annealing, the bonded substrates came to be separated into two sheets at around the projection range of the ion implantation. The ion implantation layer remaining on the second substrate was selectively etched by a mixture of 49% hydrofluoric acid and aqueous 30% hydrogen peroxide with stirring. Thereby the ion implantation layer was completely etched off with the single crystal Si remaining unetched as the etch-stopping material.

Thus, a single crystal Si layer of 0.2 μm thick was formed on the Si oxide film. The thickness of the formed single crystal Si layer was measured at 100 points over the entire layer, and the uniformity of the film thickness was found to be 201 nm ±6 nm.

The substrate having the single crystal Si layer transferred thereon was heat treated at 1100° C. for one hour in a hydrogen atmosphere. The surface roughness was about 0.2 nm in terms of average square roughness for a 50 μm square region as measured by interatomic force microscopy. This is the same level as that of the commercial Si wafer.

No crystal defect was found to be introduced additionally into the Si layer, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate or the second substrate.

EXAMPLE 4

On a single crystal Si substrate (first substrate), single crystal Si was grown epitaxially in a thickness of 0.30 μm by CVD (chemical vapor deposition) under the growth conditions below.

Source gas: $SiH_2Cl_2/H_2$

Gas flow rate: 0.5/180 L/min

Gas pressure: 80 Torr

Temperature: 950° C.

Growth rate: 0.30 μm/min

On the surface of this epitaxial Si layer, an $SiO_2$ layer was formed in a thickness of 200 nm by thermal oxidation. Then $H^+$ was implanted through the $SiO_2$ layer surface at 40 keV at a dose of $5 \times 10^{16}$ $cm^{-2}$.

Separately, a molten quartz substrate (second substrate) was provided. The surface of the $SiO_2$ layer of the first substrate and the surface of the molten quartz substrate were subjected to plasma treatment, and washed with water. The both faces were brought into contact with the each other, and the bonded substrates were annealed at 600° C. By the annealing, the bonded substrates came to be separated into two sheets at around the projection range of the ion implantation. The surfaces of the separated substrates were rough owing to the porosity of the ion implantation layer. The surface of the second substrate was selectively etched by a mixture of 49% hydrofluoric acid and aqueous 30% hydrogen peroxide with stirring. Thereby the ion implantation layer was completely etched off with the single crystal Si remaining unetched as the etch-stopping material.

Thus, a single crystal Si layer of 0.2 μm thick was formed on the transparent quartz substrate. The thickness of the formed single crystal Si layer was measured at 100 points over the entire layer, and the uniformity of the layer thickness was found to be 201 nm ±6 nm.

The substrate having the single crystal Si layer transferred thereon was heat treated at 1100° C. for one hour in a hydrogen atmosphere. The surface roughness was about 0.2 nm in terms of average square roughness for a 50 μm square region as measured by interatomic force microscopy. This is the same level as that of the commercial Si wafer.

No crystal defect was found to be introduced additionally into the Si layer, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate.

EXAMPLE 5

On a single crystal Si substrate (first substrate), single crystal Si was grown epitaxially in a thickness of 0.50 μm by CVD (chemical vapor deposition) under the growth conditions below.

Source gas: $SiH_2Cl_2/H_2$

Gas flow rate: 0.5/180 L/min

Gas pressure: 80 Torr

Temperature: 950° C.

Growth rate: 0.30 μm/min

On the surface of this epitaxial Si layer, an $SiO_2$ layer was formed in a thickness of 200 nm by thermal oxidation. Then $H^+$ was implanted through the surface $SiO_2$ layer at 60 keV at a dose of $5 \times 10^{16}$ $cm^{-2}$.

Separately, a sapphire substrate (second substrate) was provided. The surface of the $SiO_2$ layer of the first substrate and the surface of the second substrate were subjected to plasma treatment, and washed with water. The both faces were brought into contact with each other, and the bonded substrates were annealed at 600° C. By the annealing, the bonded substrates came to be separated into two sheets at around the projection range of the ion implantation. The surface of the second substrate was selectively etched by a mixture of 49% hydrofluoric acid and aqueous 30% hydrogen peroxide with stirring. Thereby the ion implantation layer was completely etched off with the single crystal Si remaining unetched as the etch-stopping material.

The etched surface was flattened by polishing.

Thus, a single crystal Si layer of 0.4 μm thick was formed on the sapphire substrate. The thickness of the formed single crystal Si layer was measured at 100 points over the entire layer, and the uniformity of the layer thickness was found to be 402 nm ±12 nm.

The surface roughness was about 0.2 nm in terms of average square roughness for a 50 μm square region as measured by interatomic force microscopy. This is the same level as that of the commercial Si wafer.

No crystal defect was found to be introduced additionally into the Si layer, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate.

EXAMPLE 6

On a single crystal Si substrate (first substrate), single crystal Si was grown epitaxially in a thickness of 0.60 μm by CVD (chemical vapor deposition) under the growth conditions below.

Source gas: $SiH_2Cl_2/H_2$

Gas flow rate: 0.5/180 L/min

Gas pressure: 80 Torr

Temperature: 950° C.

Growth rate: 0.30 μm/min

On the surface of this epitaxial Si layer, an $SiO_2$ layer was formed in a thickness of 200 nm by thermal oxidation. Then $H^+$ was implanted through the $SiO_2$ surface layer at 70 keV at a dose of $5 \times 10^{16}$ $cm^{-2}$.

Separately, a glass substrate (second substrate) was provided. The surface of the $SiO_2$ layer of the first substrate and the surface of the second substrate were subjected to plasma treatment, and washed with water. The both faces were brought into contact with each other, and the bonded substrates were annealed at 600° C. By the annealing, the bonded substrates came to be separated into two sheets at around the projection range of the ion implantation. The surface of the second substrate was selectively etched by a mixture of 49% hydrofluoric acid and aqueous 30% hydrogen peroxide with stirring. Thereby the ion implantation layer was completely etched off with the single crystal Si remaining unetched as the etch-stopping material.

The etched surface was flattened by polishing.

Thus, a single crystal Si layer of 0.5 μm thick was formed on the transparent glass substrate. The thickness of the formed single crystal Si layer was measured at 100 points over the entire layer, and the uniformity of the thickness was found to be 501 nm ±15 nm.

The surface roughness was about 0.2 nm in terms of average square roughness for a 50 μm square region as measured by interatomic force microscopy. This is the same level as that of the commercial Si wafer.

No crystal defect was found to be introduced additionally into the Si layer, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate.

EXAMPLE 7

On a single crystal Si substrate (first substrate), single crystal GaAs was grown epitaxially in a thickness of 0.5 μm by MOCVD (metal organic chemical vapor deposition) under the growth conditions below.

Source gas: $TMG/AsH_3/H_2$

Gas pressure: 80 Torr

Temperature: 700° C.

On the surface of this GaAs layer, an $SiO_2$ layer was formed in a thickness of 50 nm. Then $H^+$ was implanted through the surface $SiO_2$ layer at 60 keV at a dose of $5 \times 10^{16}$ cm$^{-2}$.

The face of the $SiO_2$ layer of the first substrate was brought into contact with the face of another Si substrate (second substrate), and the bonded substrates were annealed at 600° C. By the annealing, the bonded substrates came to be separated into two sheets at around the projection range of the ion implantation. The surfaces of the separated substrates were rough owing to the porosity of the ion implantation layer. The surface of the second substrate was selectively etched by a mixture of ethylenediamine, pyrocatechol, and water (mixing ratio=17 mL:3 g:8 mL) at 110° C. Thereby the ion implantation layer and the residual first Si substrate were completely etched off with the single crystal GaAs remaining unetched as the etch-stopping material.

Thus, a single crystal GaAs layer of 0.5 μm thick was formed on the Si substrate. The thickness of the formed single crystal GaAs layer was measured at 100 points over the entire layer, and layer thickness uniformity was found to be 504 nm ±16 nm.

The surface roughness was about 0.3 nm in terms of average square roughness for a 50 μm square region as measured by interatomic force microscopy. This is the same level as that of the commercial GaAs wafer.

No crystal defect was found to be introduced additionally into the GaAs layer after the epitaxial growth, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate or the second substrate.

EXAMPLE 8

On a single crystal Si substrate (first substrate), single crystal InP was grown epitaxially in a thickness of 0.7 μm by MOCVD (metal organic chemical vapor deposition).

On the surface of this InP layer, an $SiO_2$ layer was formed in a thickness of 50 nm. Then $H^+$ was implanted through the $SiO_2$ surface layer at 80 keV at a dose of $5 \times 10^{16}$ cm$^{-2}$.

The face of the $SiO_2$ layer of the first substrate was brought into contact with the face of another Si substrate (second substrate), and annealed at 600° C. By the annealing, the bonded substrates came to be separated into two sheets at around the projection range of the ion implantation. The surfaces of the separated substrates were rough owing to the porosity of the ion implantation layer. The surface of the second substrate was selectively etched by a mixture of 49% hydrofluoric acid and aqueous 30% hydrogen peroxide with stirring. Thereby the ion implantation layer and the residual first Si substrate were completely etched off with the single crystal InP remaining unetched as the etch-stopping material.

Thus, a single crystal InP layer of 0.5 μm thick was formed on the Si substrate. The thickness of the formed single crystal InP layer was measured at 100 points over the entire layer, and layer thickness uniformity was found to be 704 nm ±23 nm.

The surface roughness was about 0.3 nm in terms of average square roughness for a 50 μm square region as measured by interatomic force microscopy. This is the same level as that of the commercial InP wafer.

No crystal defect was found to be introduced additionally into the InP layer after the epitaxial growth, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate or the second substrate.

EXAMPLE 9

On a single crystal Si substrate (first substrate), single crystal Si was grown epitaxially in a thickness of 0.30 μm by CVD (chemical vapor deposition) under the growth conditions below.

Source gas: $SiH_2Cl_2/H_2$

Gas flow rate: 0.5/180 L/min

Gas pressure: 80 Torr

Temperature: 950° C.

Growth rate: 0.30 μm/min

On the surface of this epitaxial Si layer, an $SiO_2$ layer was formed in a thickness of 200 nm by thermal oxidation. Then $He^+$ was implanted through the surface $SiO_2$ layer at 80 keV at a dose of $5 \times 10^{16}$ cm$^{-2}$.

The face of the $SiO_2$ layer was brought into contact with the face of another Si substrate (second substrate), and annealed at 600° C. By the annealing, the bonded substrates came to be separated into two sheets at around the projection range of the ion implantation. The surface of the second substrate was selectively etched by a mixture of 49% hydrofluoric acid and aqueous 30% hydrogen peroxide with stirring. Thereby the ion implantation layer was completely etched off with the single crystal Si remaining unetched as the etch-stopping material.

Thus, a single crystal Si layer of 0.2 µm thick was formed on the Si oxide film. The thickness of the formed single crystal Si layer was measured at 100 points over the entire layer, and the thickness uniformity was found to be 201 nm ±6 nm.

This substrate was heat-treated at 1100° C. for one hour in a hydrogen atmosphere. The surface roughness was about 0.2 nm in terms of average square roughness for a 50 µm square region as measured by interatomic force microscopy. This is the same level as that of the commercial Si wafer.

No crystal defect was found to be introduced additionally into the Si layer, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate or the second substrate.

EXAMPLE 10

On a single crystal Si substrate (first substrate), single crystal Si was grown epitaxially in a thickness of 0.30 µm by CVD (chemical vapor deposition) under the growth conditions below.

Source gas: $SiH_2Cl_2/H_2$
Gas flow rate: 0.5/180 L/min
Gas pressure: 80 Torr
Temperature: 950° C.
Growth rate: 0.30 µm/min On the surface of this epitaxial Si layer, an $SiO_2$ layer was formed in a thickness of 200 nm by thermal oxidation. Then $H^+$ was implanted through the $SiO_2$ surface layer at 40 keV at a dose of $5\times10^{16}$ $cm^{-2}$.

The face of the $SiO_2$ layer was brought into contact with the face of another Si substrate (second substrate).

After removal of an oxide film from the reverse face of the first substrate, the entire face of the wafer was irradiated with $CO_2$ laser from the first substrate side. The $CO_2$ laser was absorbed by the 200 nm thick $SiO_2$ layer at the bonding interface to cause abrupt temperature rise there, and the bonded substrates came to be separated by thermal stress into two sheets at around the projection range of the ion implantation. The laser beam may be continuous of pulsative.

The surface of the second substrate was selectively etched by a mixture of 49% hydrofluoric acid and aqueous 30% hydrogen peroxide with stirring. Thereby the ion implantation layer was completely etched off with the single crystal Si remaining unetched as the etch-stopping material.

Thus, a single crystal Si layer of 0.2 µm thick was formed on the Si oxide film. The thickness of the formed single crystal Si layer was measured at 100 points over the entire layer, and the thickness uniformity was found to be 201 nm ±6 nm.

This substrate was heat-treated at 1100° C. for one hour in a hydrogen atmosphere. The surface roughness was about 0.2 nm in terms of average square roughness for a 50 µm square region as measured by interatomic force microscopy. This is the same level as that of the commercial Si wafer.

No crystal defect was found to be introduced additionally into the Si layer, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate or the second substrate.

EXAMPLE 11

On a single crystal Si substrate (first substrate), single crystal Si was grown epitaxially in a thickness of 0.30 µm by CVD (chemical vapor deposition) under the growth conditions below.

Source gas: $SiH_2Cl_2/H_2$
Gas flow rate: 0.5/180 L/min
Gas pressure: 80 Torr
Temperature: 950° C.
Growth rate: 0.30 µm/min On the surface of this epitaxial Si layer, an $SiO_2$ layer was formed in a thickness of 200 nm by thermal oxidation. Then $H^+$ was implanted through the $SiO_2$ surface layer at 40 keV at a dose of $5\times10^{16}$ $cm^{-2}$.

The face of the $SiO_2$ layer was brought into contact with the face of another Si substrate (second substrate). By etching the end face of the bonded wafer, the end of the $SiO_2$ layer and the end of the epitaxial layer were peeled, and the end of the ion implantation layer was bared.

The bonded wafer was subjected to pyro-oxidation at 1000° C. Thereby, the two bonded substrates came to be separated completely in 10 hours at the ion implantation layer. The detached faces were found to have changed to $SiO_2$ at the wafer periphery portion with the center portion changed little.

The surface of the second substrate was selectively etched by a mixture of 49% hydrofluoric acid and aqueous 30% hydrogen peroxide with stirring. Thereby the ion implantation layer was completely etched off with the single crystal Si remaining unetched as the etch-stopping material.

Thus, a single crystal Si layer of 0.2 µm thick was formed on the Si oxide film. The thickness of the formed single crystal Si layer was measured at 100 points over the entire layer, and the thickness uniformity was found to be 201 nm ±6 nm.

This substrate was heat-treated at 1100° C. for one hour in a hydrogen atmosphere. The surface roughness was about 0.2 nm in terms of average square roughness for a 50 µm square region as measured by interatomic force microscopy. This is the same level as that of the commercial Si wafer.

No crystal defect was found to be introduced additionally into the Si layer, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate or the second substrate.

EXAMPLE 12

On a single crystal Si substrate (first substrate), single crystal Si was grown epitaxially in a thickness of 0.30 μm by CVD (chemical vapor deposition) under the growth conditions below.

Source gas: $SiH_2Cl_2/H_2$
Gas flow rate: 0.5/180 L/min
Gas pressure: 80 Torr
Temperature: 950° C.
Growth rate: 0.30 μm/min On the surface of this epitaxial Si layer, an $SiO_2$ layer was formed in a thickness of 200 nm by thermal oxidation. Then $H^+$ was implanted through the surface $SiO_2$ layer at 40 keV at a dose of $5\times10^{16}$ $cm^{-2}$.

Separately, another Si substrate (second substrate) was provided. The surface of the $SiO_2$ layer of the first substrate and the surface of the second substrate were subjected to plasma treatment, and washed with water. The both faces were brought into contact with each other, and the bonded substrates were heat-treated at 300° C. for one hour to increase the strength of the bonding of the substrates. By wedging into the bonded substrates from the periphery, the bonded substrates were separated into two sheets at around the projection range of the ion implantation. The surfaces of the separated substrates were rough owing to the porosity of the ion implantation layer. The surface of the second substrate was selectively etched by a mixture of 49% hydrofluoric acid and aqueous 30% hydrogen peroxide with stirring. Thereby the ion implantation layer was completely etched off with the single crystal Si remaining unetched as the etch-stopping material.

Thus, a single crystal Si layer of 0.2 μm thick was formed on the Si oxide film. The thickness of the formed single crystal Si layer was measured at 100 points over the entire layer, and the thickness uniformity was found to be 201 nm ±6 nm.

This substrate was heat-treated at 1100° C. for one hour in a hydrogen atmosphere. The surface roughness was about 0.2 nm in terms of average square roughness for a 50 μm square region as measured by interatomic force microscopy. This is the same level as that of the commercial Si wafer.

No crystal defect was found to be introduced additionally into the Si layer, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate or the second substrate.

EXAMPLE 13

On a single crystal Si substrate (first substrate), single crystal Si was grown epitaxially in a thickness of 0.30 μm by CVD (chemical vapor deposition) under the growth conditions below.

Source gas: $SiH_2Cl_2/H_2$
Gas flow rate: 0.5/180 L/min
Gas pressure: 80 Torr
Temperature: 950° C.
Growth rate: 0.30 μm/min On the surface of this epitaxial Si layer, an $SiO_2$ layer was formed in a thickness of 200 nm by thermal oxidation. Then $H^+$ was implanted through the $SiO_2$ surface layer at 40 keV at a dose of $5\times10^{16}$ $cm^{-2}$.

Separately, another Si substrate (second substrate) was provided. The surface of the $SiO_2$ layer of the first substrate and the surface of the second substrate were subjected to plasma treatment, and washed with water. The both faces were brought into contact with each other, and the bonded substrates were heat-treated at 300° C. for one hour to increase the strength of the bonding of the substrates. On application of shear force to the bonded substrates, the bonded substrates were separated into two sheets at around the projection range of the ion implantation. The surface of the second substrate was selectively etched by a mixture of 49% hydrofluoric acid and aqueous 30% hydrogen peroxide with stirring. Thereby the ion implantation layer was completely etched off with the single crystal Si remaining unetched as the etch-stopping material.

Thus, a single crystal Si layer of 0.2 μm thick was formed on the Si oxide film. The thickness of the formed single crystal Si layer was measured at 100 points over the entire layer, and the thickness uniformity was found to be 201 nm ±6 nm.

This substrate was heat-treated at 1100° C. for one hour in a hydrogen atmosphere. The surface roughness was about 0.2 nm in terms of average square roughness for a 50 μm square region as measured by interatomic force microscopy. This is the same level as that of the commercial Si wafer.

No crystal defect was found to be introduced additionally into the Si layer, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate or the second substrate.

For reuse as the first substrate, the decrease of the wafer thickness was supplemented by epitaxial layer growth. Thus the substrate was made reusable semipermanently. In the second or later use, the epitaxial layer thickness is not 0.30 μm, but corresponds to thickness decrease, and the ion implantation layer is formed inside the epitaxial layer.

EXAMPLE 14

Onto a main face of a single crystal Si substrate (first substrate), $H^+$ was implanted at 10 keV at a dose of $5\times10^{16}$ $cm^{-2}$. On the same face, single crystal Si was grown epitaxially in a thickness of 0.30 μm by CVD (chemical vapor deposition) under the growth conditions below.

Source gas: $SiH_2Cl_2/H_2$
Gas flow rate: 0.5/180 L/min
Gas pressure: 80 Torr
Temperature: 950° C.
Growth rate: 0.30 μm/min On the surface of this epitaxial Si layer, an $SiO_2$ layer was formed in a thickness of 200 nm.

The face of the $SiO_2$ layer of the first substrate was brought into contact with the face of another Si substrate (second substrate), and the bonded substrates were annealed at 600° C. By the annealing, the bonded substrates came to be separated into two sheets at around the projection range of the ion implantation.

The surfaces of the separated substrates were rough owing to the porosity of the ion implantation layer. The surface of the second substrate was selectively etched by a mixture of 49% hydrofluoric acid and aqueous 30% hydrogen peroxide with stirring. Thereby the ion implantation layer was completely etched off with the single crystal Si remaining unetched as the etch-stopping material. Further, the remaining first substrate corresponding to the ion implantation depth level was removed by etching.

Thus, a single crystal Si layer of 0.2 µm thick was formed on the Si oxide film. The thickness of the formed single crystal Si layer was measured at 100 points over the entire layer, and the thickness uniformity was found to be 201 nm ±7 nm.

This substrate was heat-treated at 1100° C. for one hour in a hydrogen atmosphere. The surface roughness was about 0.2 nm in terms of average square roughness for a 50 µm square region as measured by interatomic force microscopy. This is the same level as that of the commercial Si wafer.

No crystal defect was found to be introduced additionally into the Si layer, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate or the second substrate.

EXAMPLE 15

On a main face of a single crystal Si substrate (first substrate), single crystal Si was grown epitaxially in a thickness of 0.50 µm by CVD (chemical vapor deposition) under the growth conditions below.

Source gas: $SiH_2Cl_2/H_2$

Gas flow rate: 0.5/180 L/min

Gas pressure: 80 Torr

Temperature: 950° C.

Growth rate: 0.30 µm/min

During the growth, a doping gas was added to obtain a substrate structure of $n^+Si/n^-Si/Si$.

On the surface of this epitaxial Si layer, an $SiO_2$ layer was formed in a thickness of 200 nm by thermal oxidation. The $H^+$ was implanted through the $SiO_2$ surface layer at 40 keV at a dose of $5\times10^{16}$ cm$^{-2}$.

The face of the $SiO_2$ layer of the first substrate was brought into contact with the face of another Si substrate (second substrate), and the substrates were annealed at 600° C. By the annealing, the bonded substrates came to be separated into two sheets at around the projection range of the ion implantation.

The surface of the second substrate was selectively etched by a mixture of 49% hydrofluoric acid and aqueous 30% hydrogen peroxide with stirring. Thereby the ion implantation layer was completely etched off with the single crystal Si remaining unetched as the etch-stopping material.

Thus, a single crystal Si layer of 0.2 µm thick containing a buried n$^+$ layer was formed on the Si oxide film. The thickness of the formed single crystal Si layer was measured at 100 points over the entire layer, and the thickness uniformity was found to be 201 nm ±6 nm.

This substrate was heat-treated at 1100° C. for one hour in a hydrogen atmosphere. The surface roughness was about 0.2 nm in terms of average square roughness for a 50 µm square region as measured by interatomic force microscopy. This is the same level as that of the commercial Si wafer.

No crystal defect was found to be introduced additionally into the Si layer, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate or the second substrate.

EXAMPLE 16

On a main face of a single crystal Si substrate (first substrate), single crystal Si was grown epitaxially in a thickness of 0.30 µm by CVD (chemical vapor deposition) under the growth conditions below.

Source gas: $SiH_2Cl_2/H_2$

Gas flow rate: 0.5/180 L/min

Gas pressure: 80 Torr

Temperature: 950° C.

Growth rate: 0.30 µm/min

During the growth, a doping gas was added to obtain a substrate structure of $n^+Si/n^-Si/Si$.

On the surface of this epitaxial Si layer, an $SiO_2$ layer was formed in a thickness of 50 nm by thermal oxidation. The $H^+$ was implanted through the $SiO_2$ at 40 keV at a dose of $5\times10^{16}$ cm$^{-2}$.

The face of the $SiO_2$ layer of the first substrate was brought into contact with the face of another Si substrate (second substrate) having an $SiO_2$ layer of 500 nm thick on the face, and the substrates were annealed at 600° C. By the annealing, the bonded substrates came to be separated into two sheets at around the projection range of the ion implantation. The surface of the second substrate was selectively etched by a mixture of 49% hydrofluoric acid and aqueous 30% hydrogen peroxide with stirring. Thereby the ion implantation layer was completely etched off with the single crystal Si remaining unetched as the etch-stopping material.

Thus, a single crystal Si layer of 0.29 µm thick containing a buried n$^+$ layer was formed on the Si oxide film. The thickness of the formed single crystal Si layer was measured at 100 points over the entire layer, and the thickness uniformity was found to be 291 nm ±9 nm.

This substrate was heat-treated at 1100° C. for one hour in a hydrogen atmosphere. The surface roughness was about 0.2 nm in terms of average square roughness for a 50 µm square region as measured by interatomic force microscopy. This is the same level as that of the commercial Si wafer.

No crystal defect was found to be introduced additionally into the Si layer, and excellent crystallinity was found to be maintained by observation of the cross section with transmission electron microscopy.

The ion implantation layer remaining on the first substrate was also etched selectively by a mixture of 49% hydrofluoric acid and aqueous 30% hydrogen peroxide with stirring. The substrate was further subjected to surface treatment such as hydrogen annealing and surface polishing. Thereby the substrate could be reused as the first substrate or the second substrate.

EXAMPLE 17

Semiconductor articles were prepared by treating the both faces of the first substrate in the same manner as in Examples 1 to 16.

What is claimed is:

1. A process for producing a semiconductor article comprising steps of preparing a first substrate comprised of a silicon substrate, an epitaxial semiconductor layer formed on the silicon substrate, and an ion implantation layer formed in at least one of the silicon substrate, wherein said silicon substrate is not a porous region, and the epitaxial semiconductor layer, wherein said epitaxial semiconductor layer is not a porous region bonding the first substrate to a second substrate to obtain a multiple layer structure with the epitaxial semiconductor layer placed inside; and separating the multiple layer structure at the ion implantation layer.

2. A process for producing a semiconductor article comprising steps of preparing a first substrate comprised of a silicon substrate, an epitaxial semiconductor layer formed on the silicon substrate, and an ion implantation layer formed in at least one of the silicon substrate, wherein said silicon substrate is not a porous region, and the epitaxial semiconductor layer, wherein said epitaxial semiconductor layer is not a porous region; bonding the first substrate to a second substrate to obtain a multiple layer structure with the epitaxial semiconductor layer placed inside; separating the multiple layer structure at the ion implantation layer; and removing the ion implantation layer remaining on the separated second substrate.

3. A process for producing a semiconductor article comprising steps of preparing a first substrate comprised of a silicon substrate, an epitaxial semiconductor layer formed on the silicon substrate, and an ion implantation layer formed in at least one of the silicon substrate, wherein said silicon substrate is not a porous region, and the epitaxial semiconductor layer, wherein said epitaxial semiconductor layer is not a porous region; bonding the first substrate to a second substrate to obtain a multiple layer structure with the epitaxial semiconductor layer placed inside; separating the multiple layer structure at the ion implantation layer; removing the ion implantation layer remaining on the separated second substrate; and reusing the first substrate, after removal of the remaining ion implantation layer therefrom, as a first or second substrate material.

4. The process for producing a semiconductor article according to any of claims 1 to 3, wherein the ion implantation layer is formed after formation of the epitaxial semiconductor layer on the silicon substrate.

5. The process for producing a semiconductor article according to any of claims 1 to 3, wherein the ion implantation layer is formed after formation of the epitaxial semiconductor layer on the silicon substrate and formation of an insulation film on the epitaxial semiconductor layer.

6. The process for producing a semiconductor article according to any of claims 1 to 3, wherein the ion implantation layer is formed with ions of elements selected from the group of rare gas elements, hydrogen, and nitrogen.

7. The process for producing a semiconductor article according to claim 6, wherein the implantation dose of the ions is controlled to be in the range from $10^{16}$ to $10^{17}/cm^2$.

8. The process for producing a semiconductor article according to any of claims 1 to 3, wherein the thickness of the ion implantation layer is controlled to be not larger than 500 Å.

9. The process for producing a semiconductor article according to claim 8, wherein the thickness of the ion implantation layer is controlled to be not larger than 200 Å.

10. The process for producing a semiconductor article according to any of claims 1 to 3, wherein the multiple layer structure is separated by applying external force to the ion implantation layer.

11. The process for producing a semiconductor article according to claim 10, wherein the external force is applied by pressing in a direction perpendicular to the substrate face, by pulling apart in a direction perpendicular to the substrate face, or by applying shear force.

12. The process for producing a semiconductor article according to any of claims 1 to 3, wherein the multiple layer structure is separated by baring the ion implantation layer at the edge of the multiple layer structure and subsequently oxidizing the bonded substrates.

13. The process for producing a semiconductor article according to any of claims 1 to 3, wherein the multiple layer structure is separated by heating the multiple layer structure.

14. The process for producing a semiconductor article according to claim 13, wherein the entire of the multiple layer structure is heated.

15. The process for producing a semiconductor article according to claim 13, wherein a portion of the multiple layer structure is heated.

16. The process for producing a semiconductor article according to claim 15, wherein the heating is conducted by laser irradiation.

17. The process for producing a semiconductor article according to claim 16, wherein the laser is carbon dioxide laser.

18. The process for producing a semiconductor article according to claim 15, wherein the heating is conducted by applying electric current.

19. The process for producing a semiconductor article according to any of claims 1 to 3, wherein the epitaxial semiconductor layer is comprised of a single crystal silicon layer.

20. The process for producing a semiconductor article according to claim 19, wherein the single crystal silicon layer is formed by a method selected from the group consisting of CVD, sputtering, MBE and liquid phase growth.

21. The process for producing a semiconductor article according to claim 19, wherein the first substrate is constructed by forming a silicon oxide layer on the surface of the single crystal silicon layer.

22. The process for producing a semiconductor article according to claim 21, wherein the silicon oxide layer is formed by thermal oxidation.

23. The process for producing a semiconductor article according to any of claims 1 to 3, wherein the epitaxial semiconductor layer is comprised of a compound semiconductor layer.

24. The process for producing a semiconductor article according to claim 23, wherein the compound semiconductor is a single crystal.

25. The process for producing a semiconductor article according to any of claims 1 to 3, wherein the second substrate comprises a single crystal silicon substrate.

26. The process for producing a semiconductor article according to any of claims 1 to 3, wherein the second substrate is a single crystal silicon substrate having an oxide film formed thereon.

27. The process for producing a semiconductor article according to any of claims 1 to 3, wherein the second substrate is a light-transmissive substrate.

28. The process for producing a semiconductor article according to claim 27, wherein the light-transmissive substrate is a glass substrate.

29. The process for producing a semiconductor article according to any of claims 1 to 3, wherein the step of bonding the substrates is conducted by bringing the first substrate and the second substrate into close contact with each other.

30. The process for producing a semiconductor article according to any of claims 1 to 3, wherein the step of bonding the substrates is conducted by anode bonding, by pressing, or by heat treatment.

31. The process for producing a semiconductor article according to any of claims 1 to 3, wherein the ion implantation layer is removed by polishing.

32. The process for producing a semiconductor article according to any of claims 1 to 3, wherein the ion implantation layer is removed by etching.

33. The process for producing a semiconductor article according to claim 32, wherein the etching is conducted with hydrofluoric acid.

34. The process for producing a semiconductor article according to any of claims 1 to 3, further comprising a step of surface-treating the first substrate, after said separating step.

35. The process for producing a semiconductor article according to claim 34, wherein said surface-treating step is a hydrogen annealing or a surface polishing.

36. The process for producing a semiconductor article according to any of claims 1 to 3, further comprising the step of forming an epitaxial layer on the resultant substrate which has been obtained by removing the ion implantation layer remaining on the first substrate side, after said separating step.

37. The process for producing a semiconductor article according to any of claims 1 to 3, further comprising a step of forming an epitaxial layer on said first substrate, after said separating step, to use the resultant as said first or second substrate.

38. The process for producing a semiconductor article according to any of claims 1 to 3, further comprising a step of heat-treating the second substrate to which said epitaxial semiconductor layer has been transferred in an atmosphere containing hydrogen, after said separating step.

39. The process for producing a semiconductor article according to any of claims 1 to 3, further comprising a step of polishing a surface of the second substrate to which said epitaxial semiconductor layer has been transferred, after said separating step.

40. The process for producing a semiconductor article according to claim 2, further comprising a step of heat-treating in hydrogen the second substrate to which said epitaxial semiconductor layer has been transferred, after said removing step.

41. The process for producing a semiconductor article according to any of claims 1 to 3, wherein said step of preparing said first substrate is a step of forming said epitaxial semiconductor layer on said silicon substrate after forming said ion implantation layer in said silicon substrate.

42. The process for producing a semiconductor article according to any of claims 1 to 3, wherein said first substrate has an insulating film on said epitaxial semiconductor layer.

43. The process for producing a semiconductor article according to any of claims 1 to 3, wherein said bonding step is accomplished by the imposition of an insulating layer between said first substrate and said second substrate.

44. The process for producing a semiconductor article according to any of claims 1 to 3, wherein said ion implantation layer is formed at an interface between said silicon substrate and said epitaxial semiconductor layer.

45. The process for producing a semiconductor article according to claim 1, wherein after said separating step, said first substrate is reused as the first substrate or the second substrate.

46. A process for producing a semiconductor article comprising the steps of preparing a first substrate comprised of a silicon substrate, an epitaxial semiconductor layer located on the silicon substrate, and an ion implantation layer formed in at least one of the silicon substrate, wherein said silicon substrate is not a porous region, and the epitaxial semiconductor layer, wherein said epitaxial semiconductor layer is not a porous region; bonding the first substrate to a second substrate to obtain a multiple layer structure with the epitaxial semiconductor layer placed inside; separating the multiple layer structure at the ion implantation layer; and then hydrogen-annealing said epitaxial semiconductor layer transferred to the second substrate after said separating step.

47. A process for producing a semiconductor article comprising the steps of preparing a first substrate comprised of a silicon substrate, wherein said silicon substrate is not a porous region, an epitaxial semiconductor layer located on the silicon substrate, wherein said epitaxial semiconductor layer is not a porous region, and an ion implantation layer formed in at least one of the silicon substrate and the epitaxial semiconductor layer; bonding the first substrate to a second substrate to obtain a multiple layer structure with the epitaxial semiconductor layer placed inside; separating the multiple layer structure at the ion implantation layer; and then polishing a surface of said epitaxial semiconductor layer transferred to the second substrate after said separating step.

48. A semiconductor article, produced by the method set forth in any of claims 1–3, 46 or 47.

49. A process for producing a semiconductor article comprising the steps of preparing a first substrate comprised of a silicon substrate and an ion implantation layer formed in said silicon substrate which is a nonporous region; bonding the first substrate to a second substrate to obtain a multiple layer structure; separating the multiple layer structure at the ion implantation layer; and then hydrogen-annealing a portion of the first substrate transferred to the second substrate.

50. The process for producing a semiconductor article according to any of claims 1 to 3, 46 to 47 and 49, wherein said bonding step is conducted to permit an insulating layer to be interposed between the first substrate and the second substrate.

51. The process for producing a semiconductor article according to claim 49, wherein said ion implantation layer of said first substrate is formed after forming an insulating layer on said silicon substrate.

52. The process for producing a semiconductor article according to claims 1 to 3, 46 to 47 and 49, wherein said ion implantation layer is formed by implanting rare gas or hydrogen or nitrogen.

* * * * *

UNITED STATES PATENT AND TRADEMARK OFFICE
CERTIFICATE OF CORRECTION

PATENT NO. : 5,966,620
DATED : October 12, 1999
INVENTOR(S) : Kiyofumi Sakaguchi, et al.

It is certified that error appears in the above-identified patent and that said Letters Patent is hereby corrected as shown below:

Column 25:
Line 9, "region" should read -- region; --.

Signed and Sealed this

Eighteenth Day of September, 2001

*Attest:*

NICHOLAS P. GODICI
*Attesting Officer*    *Acting Director of the United States Patent and Trademark Office*

UNITED STATES PATENT AND TRADEMARK OFFICE
CERTIFICATE OF CORRECTION

PATENT NO.  : 5,966,620
DATED       : October 12, 1999
INVENTOR(S) : Kiyofumi Sakaguchi et al.

It is certified that error appears in the above-identified patent and that said Letters Patent is hereby corrected as shown below:

Title page,
Item [56] References Cited, under FOREIGN PATENT DOCUMENTS,
"5211128" should read -- 5-211128 --;
"7302889" should read -- 7-302889 --; and
"8213645" should read -- 8-213645 --; and OTHER PUBLICATIONS, after "Q. Tong," "wafebonding:" should read -- wafer bonding: --.

Column 3,
Line 12, "that is" should be deleted;
Line 17, "above described" should read -- above-described --; and
Line 26, "include;" should read -- include: --.

Column 7,
Line 40, "article" should read -- articles --.

Column 12,
Line 12, "unacceptably, rough" should read -- unacceptably rough --.

Column 19,
Line 54, "of" should read -- or --.

Signed and Sealed this

Twenty-second Day of January, 2002

*Attest:*

JAMES E. ROGAN
*Attesting Officer*     *Director of the United States Patent and Trademark Office*